United States Patent
Kuo et al.

(10) Patent No.: US 9,040,352 B2
(45) Date of Patent: May 26, 2015

(54) FILM-ASSIST MOLDED GEL-FILL CAVITY PACKAGE WITH OVERFLOW RESERVOIR

(75) Inventors: Shun Meen Kuo, Chandler, AZ (US); Li Li, Scottsdale, AZ (US)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 138 days.

(21) Appl. No.: 13/535,438

(22) Filed: Jun. 28, 2012

(65) Prior Publication Data

US 2014/0001582 A1    Jan. 2, 2014

(51) Int. Cl.
| | |
|---|---|
| *H01L 23/495* | (2006.01) |
| *H01L 23/24* | (2006.01) |
| *H01L 23/31* | (2006.01) |
| *B60C 3/00* | (2006.01) |
| *B60C 23/04* | (2006.01) |

(52) U.S. Cl.
CPC ............ *H01L 23/24* (2013.01); *H01L 23/3107* (2013.01); *H01L 23/315* (2013.01); *H01L 23/49575* (2013.01); *H01L 2224/48137* (2013.01); *H01L 2224/48247* (2013.01); *H01L 2224/48257* (2013.01); *H01L 2924/1815* (2013.01); *H01L 2924/1461* (2013.01); *B60C 3/00* (2013.01); *B60C 23/04* (2013.01)

(58) Field of Classification Search
CPC . H01L 21/563; H01L 21/565; H01L 23/3157; H01L 21/56; H01L 23/315; H01L 25/0657; H01L 2924/01079; H01L 2224/48091; H01L 2924/15311; H01L 2924/14; B81C 1/0023; G01P 15/0802; G01P 15/125; G01P 15/18; G01P 1/023; B81B 2201/0235

USPC ............. 257/417, 678, 787, 415, 777, 712; 438/112

See application file for complete search history.

(56) References Cited

U.S. PATENT DOCUMENTS

| | | | | |
|---|---|---|---|---|
| 5,581,226 | A | * | 12/1996 | Shah ................................ 338/42 |
| 5,891,483 | A | | 4/1999 | Miyajima |
| 6,929,977 | B2 | | 8/2005 | Takase et al. |
| 7,020,958 | B1 | | 4/2006 | Carapella et al. |
| 7,187,073 | B2 | | 3/2007 | Shoji |
| 7,944,062 | B2 | | 5/2011 | Groenhuis et al. |
| 2003/0143406 | A1 | * | 7/2003 | Siegel et al. ................... 428/447 |
| 2005/0236644 | A1 | | 10/2005 | Getten et al. |
| 2006/0220256 | A1 | * | 10/2006 | Shim et al. ..................... 257/777 |
| 2011/0036174 | A1 | * | 2/2011 | Hooper et al. .................. 73/721 |

* cited by examiner

*Primary Examiner* — Kenneth Parker
*Assistant Examiner* — Bo Fan
(74) *Attorney, Agent, or Firm* — Jonathan N. Geld

(57) ABSTRACT

A semiconductor device package having a cavity formed using film-assisted molding techniques is provided. Through the use of such techniques the cavity can be formed in specific locations in the molded package, such as on top of a device die mounted on the package substrate or a lead frame. In order to overcome cavity wall angular limitations introduced by conformability issues associated with film-assisted molding, a gel reservoir feature is formed so that gel used to protect components in the cavity does not come in contact with a lid covering the cavity or the junction between the lid and the package attachment region. The gel reservoir is used in conjunction with a formed level setting feature that controls the height of gel in the cavity. Benefits include decreased volume of the cavity, thereby decreasing an amount of gel-fill needed and thus reducing production cost of the package.

5 Claims, 6 Drawing Sheets

FILM-ASSIST MOLDED GEL-FILL CAVITY PACKAGE WITH OVERFLOW RESERVOIR

BACKGROUND

1. Field

This disclosure relates generally to semiconductor device packaging, and more specifically, to forming a gel-filled cavity package having an overflow reservoir using film-assisted molding.

2. Related Art

Many of today's automobiles provide constant monitoring of the state of the vehicle for safety and informative purposes. One common monitoring feature found in many automobiles is a tire pressure monitoring system. Typically, pressure sensors coupled to transmitters are mounted in each wheel of the car. If the pressure of the tire drops below a predetermined value, a signal is transmitted from the pressure sensor and provided to a diagnostic information center of the vehicle.

A typical pressure sensor semiconductor device package can incorporate a microcontroller unit, a pressure sensing cell and one or more other sensors coupled to the microcontroller unit. The pressure sensing cell can be mounted in a cavity of a pre-molded plastic package having a lid with one or more holes allowing the ambient air pressure to enter the cavity. The pressure sensing cell is protected from contaminants in the ambient air (e.g., water, oil, or dirt), by a protective coating, such as a silicone gel, which is added to the cavity to cover both the pressure sensing cell and any exposed connections in the cavity. In order to stop the gel from creeping up to the lid/package attachment junction, sharp edged features are molded into the cavity wall.

The gel used to fill the cavity is relatively expensive. Since the size of the pre-molded package cavities is typically large, this results in significant additional production costs for the packaged pressure sensor devices. Further, the interface between a package lead frame and the pre-molded package material can trap air bubbles which can be released into the gel during ambient air pressure decrease events. These air bubbles can decrease the accuracy of the pressure sensor device and interfere with capacitive signal transmission within the package cavity.

It is therefore desirable to provide a cavity semiconductor device package that decreases the gel volume as well as decreases any opportunity for bubble formation. Such a cavity semiconductor device package should also provide for measures to stop any gel used to protect devices in the package from contacting the lid of the package or the lid/package attachment junction.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide a semiconductor device package having a cavity formed using film-assisted molding techniques. Through the use of such techniques the cavity can be formed in specific locations in the molded package, such as on top of a device die mounted on the package substrate or a lead frame. In order to overcome cavity wall angular limitations introduced by film-assisted molding, a gel reservoir feature is formed so that gel used to protect components in the cavity does not come in contact with a lid covering the cavity or the junction between the lid and the package attachment region. The gel reservoir is used in conjunction with a formed level setting feature that controls the height of gel in the cavity. Benefits of such a package include decreased volume of the cavity, thereby decreasing an amount of gel-fill needed and thus reducing production cost of the package. Further, having a cavity with a mold compound/semiconductor interface at the base will decrease chances of bubble formation in a mold compound/lead frame junction region.

Figure 1:
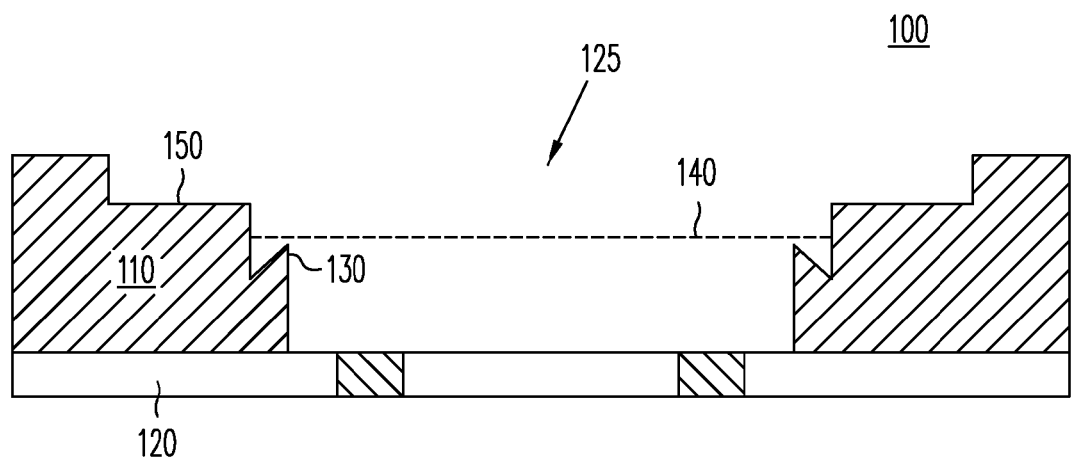
FIG. 1 is a cross section view of a pre-molded plastic cavity package used in the prior art for gel protected devices, such as pressure sensors.

FIG. 1 is a cross section view of a pre-molded plastic cavity package used in the prior art for gel protected devices, such as pressure sensors. Pre-molded plastic cavity package 100 includes a mold compound 110 formed on a lead frame 120. It should be realized that a package substrate can be used instead of lead frame 120. The pre-molded plastic cavity package is formed using a thermal plastic and a mold formed in the desired shape to provide cavity 125. Molds of this type can provide sharp edges such as those in wall feature 130.

Wall feature 130 is provided to aid in stopping gel used to protect devices in the cavity from creeping above a level 140, thereby preventing the gel from interacting with a lid placed in lid attach shoulder 150. This is desirable so that the gel does not, for example, plug an ambient gas ingress port in the lid, or interfere with adhesion of the lid to the lid attach shoulder.

As discussed above, one drawback of the prior art cavity package of FIG. 1 is the size of the cavity. Typically, the cavity in such a package provides access to a large portion of the lead frame on which the package is built. This is because the packages tend to be pre-made and the semiconductor die for the packages are subsequently attached to flags in the cavity and wire bonded to the lead frame. This results in a large volume that ultimately needs to be filled with protective gel and a corresponding significant cost.

The type of metal that is used for the lead frame contacts has properties that make the contacts well-suited to wire bonding processes. For example, a typical lead frame is made of copper plated with nickel and gold, or nickel, palladium and gold. The use of gold in the plating material forms a relatively smooth surface on the lead frame. In addition, the plating material is not chemically active, and therefore doesn't tarnish like unprotected copper. But these features of smoothness and lack of chemical activity also contribute to poor adhesion of molding material with the surface of the plated lead frame. This poor adhesion leads to micro gaps that can trap high-pressure air during use of a pressure sensor installed in such a package.

If such a package is incorporated into a tire pressure monitoring system (TPMS) exposed to high pressure (e.g., during tire inflation), high-pressure air can diffuse through the silicone gel and be stored in the micro gaps. If a rapid decompression event occurs, the air stored in the gaps can escape, resulting in bubbles forming within the silicone gel. The bubbles can interact with wirebond connections and microelectromechanical systems (MEMS) structures (e.g., pressure sensors), which can cause errors in pressure readings or device failure.

An alternative method that solves both of the issues presented by pre-formed cavity packages is to form encapsulant on all portions of the semiconductor device package except where a cavity is necessary (e.g., in an area where the pressure sensor device is mounted). One method for forming the encapsulant such that the smaller cavity is produced is a film-assisted molding techniques known in the art. For example, the film-assisted molding can be performed by pressing a pin onto the top of the die with a flexible film between the pin and the mold compound. The mold compound will not flow to any location in which the pin is pressing. The smaller cavity can be formed directly over a processor die that has contacts on its top surface to be electrically coupled to the pressure sensor. Thus, such a cavity reduces the volume to be filled by silicone gel and eliminates or reduces regions where the molding material and a metallic lead frame interact.

Figure 2:
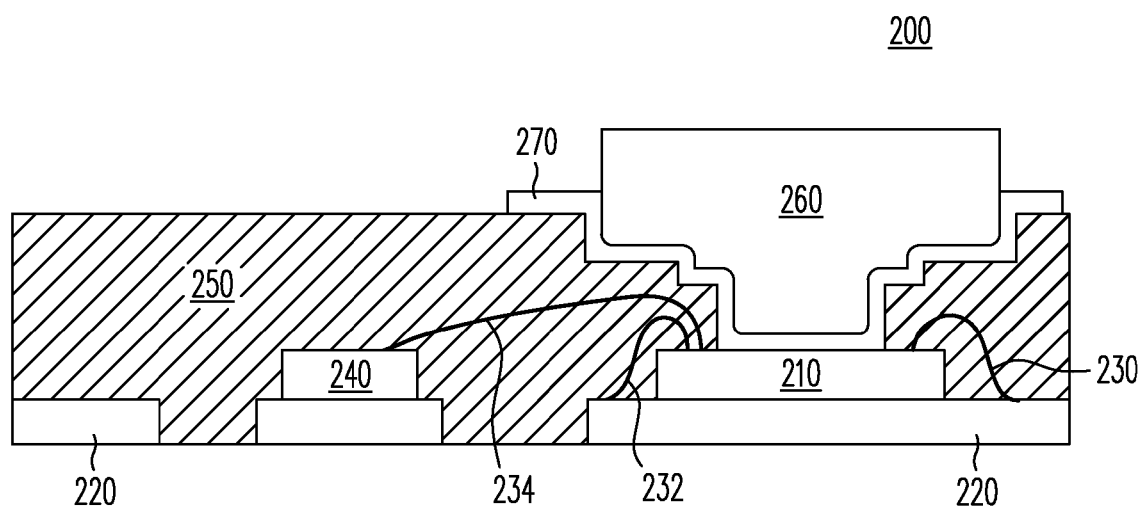
FIG. 2 is a simplified block diagram illustrating a cross-section of one embodiment of forming a semiconductor device package 200 using film-assisted molding techniques to create a cavity.

FIG. 2 is a simplified block diagram illustrating a cross-section of one embodiment of forming a semiconductor device package 200 using film-assisted molding techniques to create a cavity. A control die 210 is mounted to a lead frame 220. Control die 210 can be a multi-processing unit (MPU) and is electrically coupled to portions of the lead frame or other package components using wire bonds 230, 232, and 234. Another semiconductor device die 240 is attached to a flag portion of lead frame 220, and is electrically coupled to control die 210 by wire bond 234. Semiconductor device die 240 is another component of the system-in-a-package, such as, for example, an inertial sensor or a transmitter.

A molding material is applied to the lead frame, control die, additional die, and wire bonds, forming an encapsulant 250 that encapsulates the structures within the molding material and forms a panel. The molding material is formed in a manner that produces a shaped cavity over a portion of control die 210. As illustrated in FIG. 2, a shaped form 260 is pushed onto a film 270 to push the molding material away from the top of control die 210. The cavity takes on the shape of shaped form 260 within limits of conformability of film 270. The molding material can be any appropriate encapsulant including, for example, silica-filled epoxy molding compounds, plastic encapsulation resins, and other polymeric materials such as silicones, polyimides, phenolics, and polyurethanes. Once the molding material is applied, the panel can be cured by exposing the materials to certain temperatures for a period of time, or by applying curing agents, or both.

Figure 3:
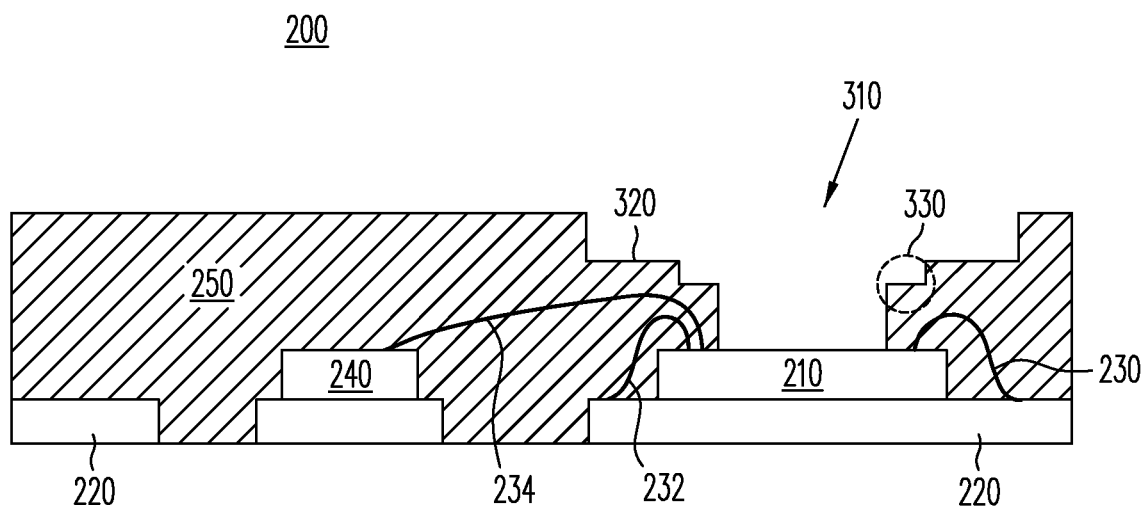
FIG. 3 is a simplified block diagram illustrating a cross-section of the embodiment of forming a semiconductor device package illustrated in FIG. 2 at a later stage in processing.

FIG. 3 is a simplified block diagram illustrating a cross-section of the embodiment of forming a semiconductor device package illustrated in FIG. 2 at a later stage in processing. In FIG. 3, shaped form 260 and film 270 have been removed leaving a cavity 310 over control die 210. Shaped form 260 defined a lid attach shoulder 320 and a step feature 330. Due to limitations in the ability of the film in forming acute angles (e.g., caused by conformability), step feature 330 cannot be formed at as sharp an angle as wall feature 130 of the pre-molded plastic cavity package of FIG. 1. Thus, while cavity 310 provides the desired reduced silicone gel fill volume, step feature 330 does not provide the gel stop functionality that wall feature 130 provides. Another drawback is that the smaller cavity results in a smaller area defined by lid attach shoulder 320 and therefore a smaller lid for cavity 310. Such a small lid can be difficult to handle and orientate by lid placement devices. Embodiments of the present invention address both of these shortcomings.

Figure 4:
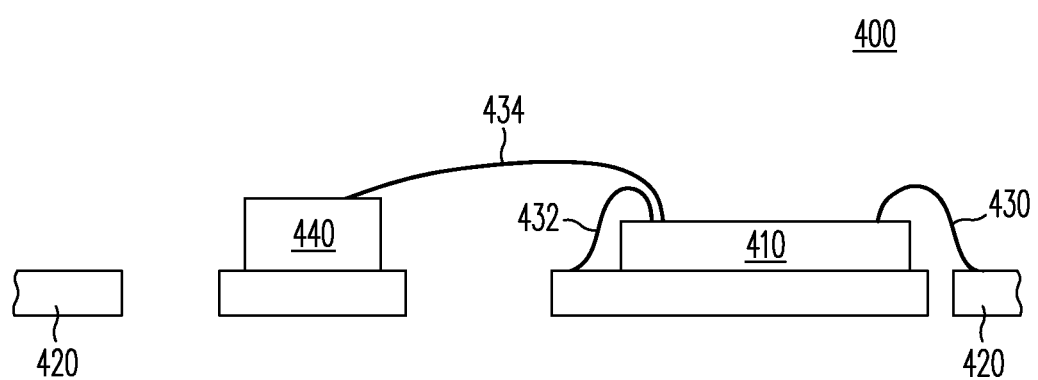
FIG. 4 is a simplified block diagram illustrating a cross-section of one embodiment of forming a semiconductor device package using film-assisted molding techniques to create a cavity, in accord with embodiments of the present invention.

FIG. 4 is a simplified block diagram illustrating a cross-section of one embodiment of forming a semiconductor device package 400 using film-assisted molding techniques to create a cavity, in accord with embodiments of the present invention. A control die 410 is mounted to a lead frame 420. As with FIG. 2, control die 410 can be a multiprocessing unit (MPU) and is electrically coupled to portions of the lead frame or other package components using wire bonds 430, 432, and 434. Another semiconductor device die 440 is attached to a flag portion of lead frame 420. As with FIG. 2, semiconductor device die 440 is another portion of the system in a package, for example, an inertial sensor or a transmitter. In the embodiment of FIG. 4, semiconductor device die 440 is electrically coupled to control die 410 using wire bond 434.

Figure 5:
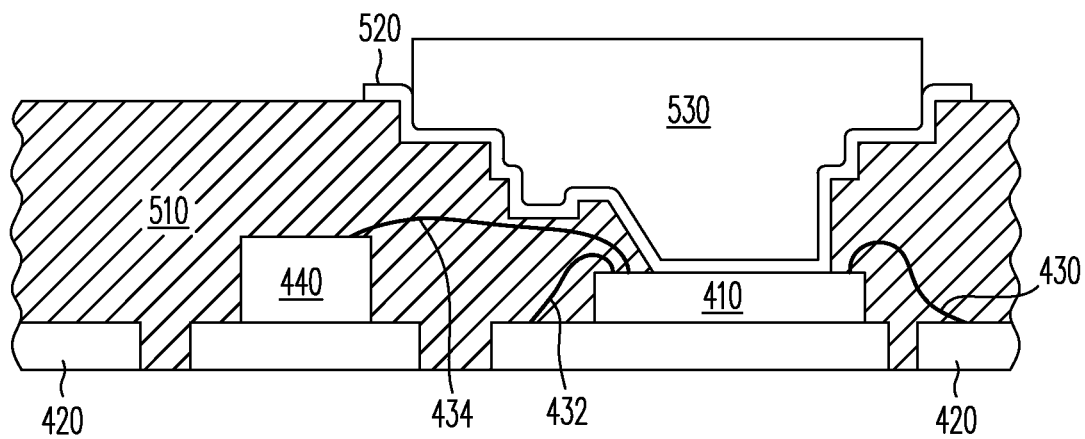
FIG. 5 is a simplified block diagram illustrating a cross-section of the embodiment of forming a semiconductor device package at a subsequent stage in processing to that of FIG. 4, in accord with embodiments of the present invention.

FIG. 5 is a simplified block diagram illustrating a cross-section of forming semiconductor device package 400 at a subsequent stage in processing to that of FIG. 4, in accord with embodiments of the present invention. A molding material is applied to the lead frame, control die, additional die, and wire bonds, forming an encapsulant 510 that encapsulates the structures within the molding material and forms a panel. The molding material is formed in a manner that produces a shaped cavity over a portion of control die 410. The molding material can be selected from those discussed above with regard to FIG. 2. As with FIG. 2, a shaped form 530 is pushed onto a film 520 to push the molding material away from the top of control die 410 and the cavity region. The cavity takes on the shape of shaped form 530 within limits of conformability of film 520. As will be discussed in greater detail below, the shape of form 530 provides gel stop features within those limits of conformability and available space.

Figure 6:
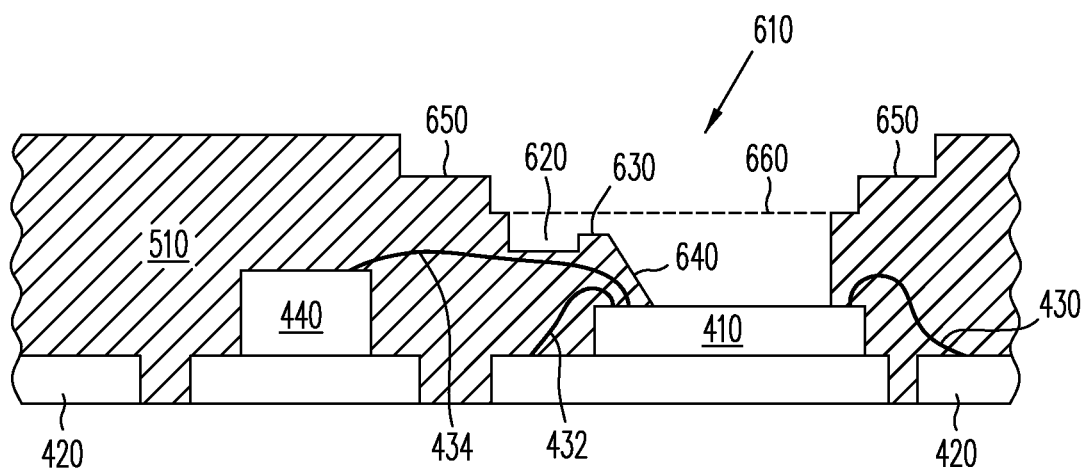
FIG. 6 is a simplified block diagram illustrating a cross-section of the embodiment of forming a semiconductor device package at a subsequent stage in processing to that of FIG. 5, in accord with embodiments of the present invention.

FIG. 6 is a simplified block diagram illustrating a cross-section of the embodiment of forming a semiconductor device package 400 at a subsequent stage in processing to that of FIG. 5, in accord with embodiments of the present invention. In FIG. 6, shaped form 530 and film 520 have been removed subsequent to curing of encapsulant 510, leaving a cavity 610 over control die 410. Cavity 610 provides gel stop features such as overflow reservoir 620, level set region 630, and slope region 640. In addition, due in part to the larger top dimension suggested by overflow reservoir 620 and level set region 630, lid attach shoulder 650 extends over a larger perimeter than lid attach shoulder 320 from FIG. 3. Thus, a larger lid can be utilized, which is easier to handle and orient than the lid for FIG. 3.

The cavity provided in FIG. 6 has an advantage of smaller volume in the region where gel may be provided, thereby reducing gel production cost. The cavity also provides, through the overflow reservoir and level set region, a means for preventing gel from rising above level 660 and thereby avoiding the lid region, as is illustrated more completely below. The shape and depth of slope region 640 and overflow reservoir 620 are chosen, in part, to accommodate components and electrical coupling that will be encapsulated within encapsulant 510.

Figure 7:
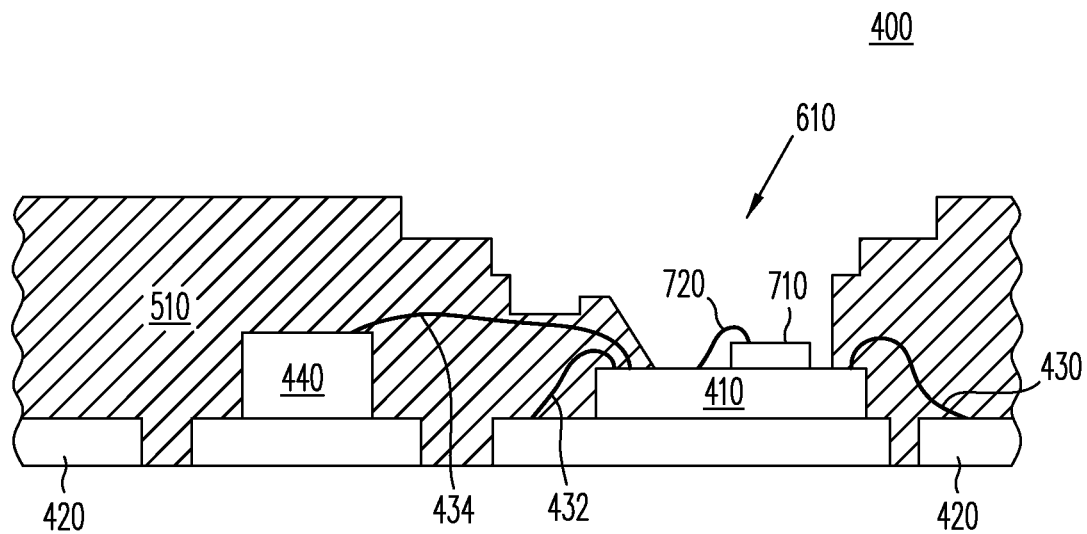
FIG. 7 is a simplified block diagram illustrating a cross-section of the embodiment of forming a semiconductor device package at a subsequent stage in processing to that of FIG. 6, in accord with embodiments of the present invention.

FIG. 7 is a simplified block diagram illustrating a cross-section of the embodiment of forming a semiconductor device package 400 at a subsequent stage in processing to that of FIG. 6, in accord with embodiments of the present invention. A pressure sensor 710 is attached to the exposed surface of control die 410 using an adhesive. In one embodiment, a silicone adhesive is used. Pressure sensor 710 can include one or more bond pads which are electrically coupled to corresponding control die bond pads using, for example, wire bond 720. Pressure sensor 710 can take the form of any type of sensor device appropriate to the application, including a micro-electromechanical system.

Figure 8:
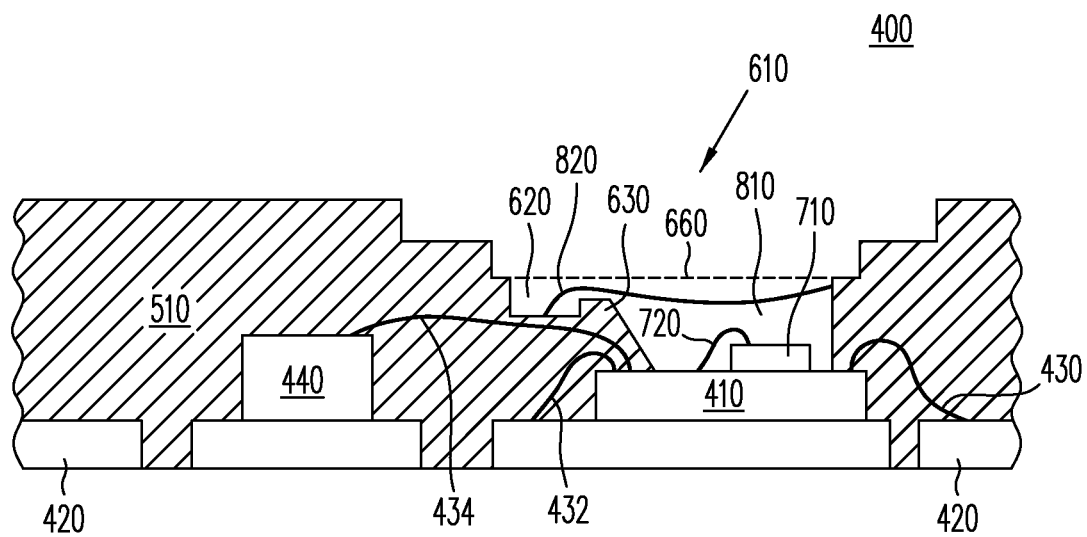
FIG. 8 is a simplified block diagram illustrating a cross-section of the embodiment of forming a semiconductor device package at a subsequent stage in processing to that of FIG. 7, in accord with embodiments of the present invention.

FIG. 8 is a simplified block diagram illustrating a cross-section of the embodiment of forming a semiconductor device package 400 at a subsequent stage in processing to that of FIG. 7, in accord with embodiments of the present invention. In FIG. 8, a gel 810 has been added to cavity 610 to a height covering pressure sensor 710 and wire bond 720. The height of gel 810 is such that a small amount of overflow gel 820 spills over level set region 630 and settles in overflow reservoir 620. As discussed above, gel 810 is selected for the particular application and typically takes the form of a silicone gel.

Figure 9:
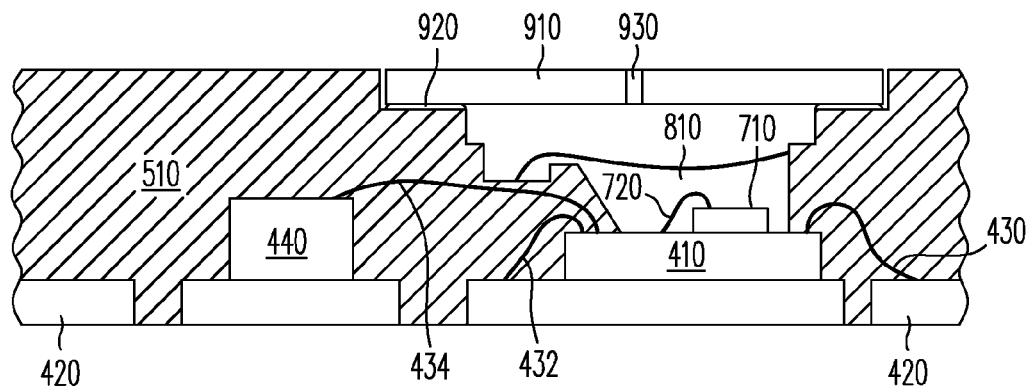
FIG. 9 is a simplified block diagram illustrating a cross-section of the embodiment of forming a semiconductor device package at a subsequent stage in processing to that of FIG. 8, in accord with embodiments of the present invention.

FIG. 9 is a simplified block diagram illustrating a cross-section of the embodiment of forming a semiconductor device package 400 at a subsequent stage in processing to that of FIG. 8, in accord with embodiments of the present invention. A lid 910 is placed over the opening of cavity 610 and is attached to lid attach shoulder 650 through the use of an adhesive 920. Lid 910 can take a variety of forms appropriate to the particular application, and can include, for example, one or more holes 930 to permit ambient gases to enter the cavity. As can be seen from FIGS. 8 and 9, gel 810 is prevented from rising above level 660 by the combination of the overflow reservoir and level set region, and thus does not interfere with the lid or adhesive in the lid attach region.

Figure 10:
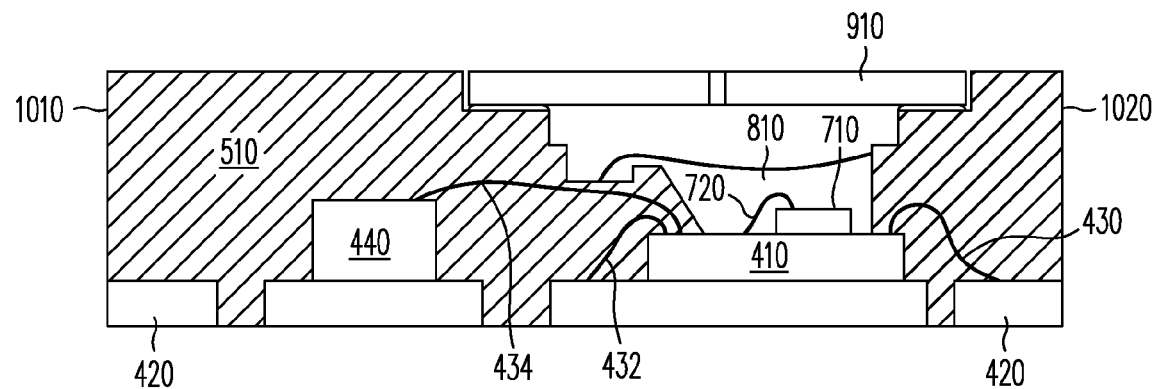
FIG. 10 is a simplified block diagram illustrating a cross-section of the embodiment of forming a semiconductor device package at a subsequent stage in processing to that of FIG. 9, in accord with embodiments of the present invention.

FIG. 10 is a simplified block diagram illustrating a cross-section of the embodiment of forming a semiconductor device package 400 at a subsequent stage in processing to that of FIG. 9, in accord with embodiments of the present invention. Subsequent to placing lid 910 on cavity 610, the panel of semiconductor device packages is singulated on planes represented by lines 1010 and 1020. Subsequent to singulation, each individual semiconductor device package 400 can be incorporated into a device suitable for the ultimate application (e.g., a tire pressure monitoring system).

As illustrated in FIGS. 6 and 8, the dimensions of cavity 610 can be chosen to accommodate the size of devices to be placed within the cavity, such as pressure sensor 710. In addition, configuration of encapsulant 510 and the cavity can be selected such that wire bonds, such as wire bonds 430, 432, and 434, are fully encapsulated, while bond pads for receiving wire bond 720 remain exposed. Further, an angle of slope 640 can be selected in response to surface tension and viscosity of gel 810 to control an amount of gel that may overflow into overflow reservoir 620.

Figure 11:
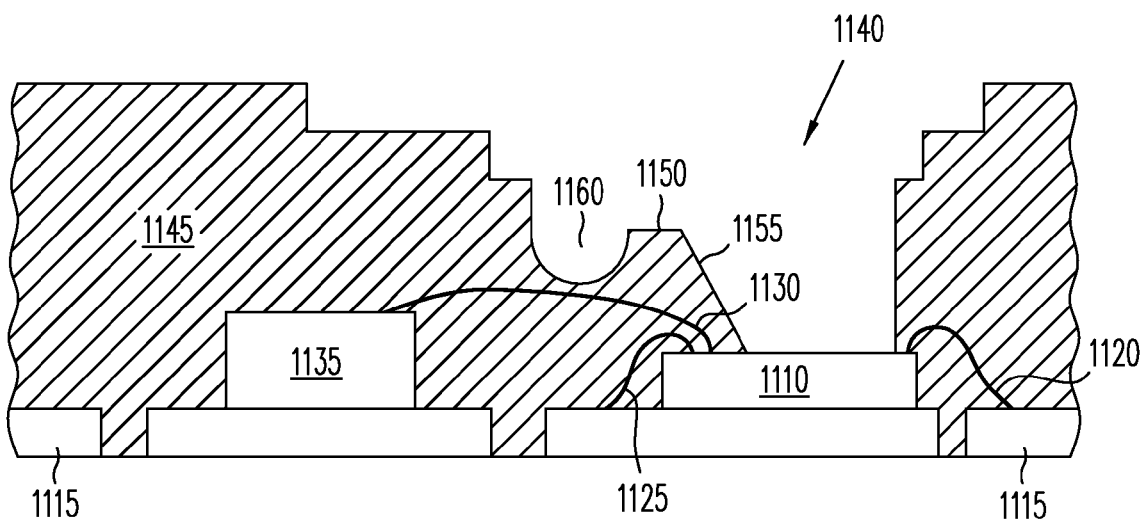
FIG. 11 is a simplified block diagram illustrating a cross-section of an embodiment of forming an semiconductor device package, in accord with alternate embodiments of the present invention.

In some applications, it may be desirable to provide a steeper slope or deeper overflow reservoir to contain the gel. FIG. 11 is an example of such an alternative embodiment. FIG. 11 is a simplified block diagram illustrating a cross-section of an embodiment of forming a semiconductor device package 1100, in accord with embodiments of the present invention. As with FIG. 4, a control die 1110 is mounted to a lead frame 1115, and is electrically coupled to portions of the lead frame or other package components using wire bonds 1120, 1125, and 1130. Another semiconductor device die 1135 is attached to a flag portion of lead frame 1115.

A molding material is applied to the lead frame, control die, additional die, and wire bonds, forming an encapsulant 1145 that encapsulates the structures within the molding material and forms a panel. The molding material is formed in a manner that produces a shaped cavity 1140 over a portion of control die 1110. The molding material can be selected from those discussed above with regard to FIG. 2, in accord with the application. As with FIG. 2 and FIG. 5, cavity 1140 is produced by a form a pushed onto a film to push the molding material away from the top of control die 1110. Cavity 1140 includes gel stop features such as overflow reservoir 1160, level set region 1150, and slope region 1155.

As can be seen from FIG. 11, reservoir 1160 is formed using a hemispherical or cylindrical shape, and can provide a deeper reservoir for gel capture. Such a deeper reservoir can be used in applications having a less viscous gel, for example. In addition, since the reservoir is deeper into the encapsulant, encapsulated structures do not rise as high above the surface of the lead frame, so that they can remain entirely within the encapsulant. Slope 1155 may also be different from slope 640 to accommodate the encapsulated structures, or to adjust for physical parameters of the gel or cavity dimensions.

Figure 12:
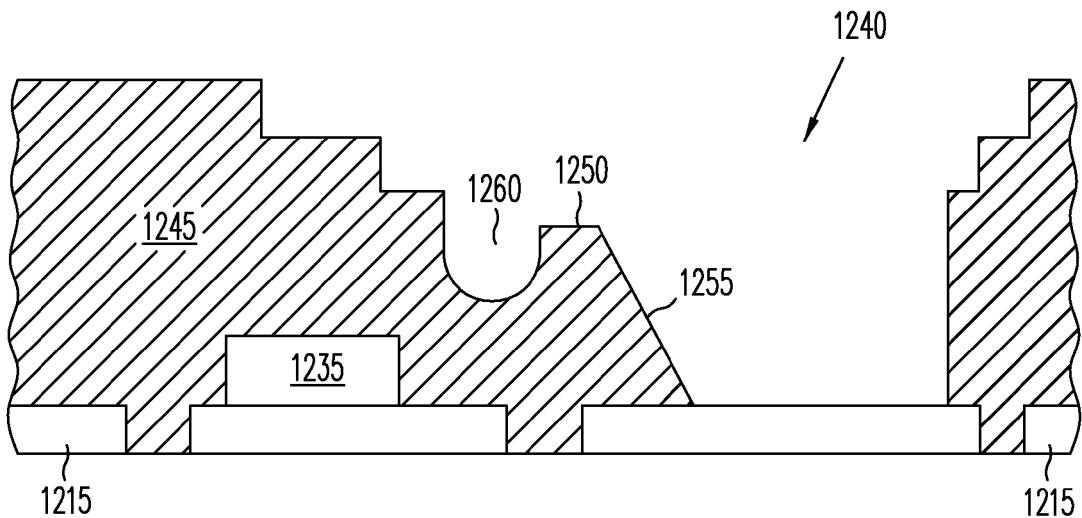
FIG. 12 is a simplified block diagram illustrating a cross-section of an embodiment of forming a semiconductor device package, in accord with an alternate embodiment of the present invention.

FIG. 12 is a simplified block diagram illustrating a cross-section of an embodiment of forming a semiconductor device package 1200, in accord with an alternate embodiment of the present invention. As illustrated, FIG. 12 provides a cavity 1240 that extends to a lead frame 1215, rather than to the top of a control die as with previously discussed embodiments. In this embodiment, a semiconductor device die 1235 is attached to lead frame 1215 both physically and electronically. A molding material is applied to the lead frame, semiconductor device die 1235, any additional die and wire bonds, forming an encapsulant 1245 that encapsulates the structures within the molding material and forms a panel. As with the above embodiments, the molding material is formed in a manner that produces a shaped cavity 1240 over a portion of lead frame 1215. Again, cavity 1240 is produced by a form pushed onto a film to push the molding material away from the top of the portion of lead frame 1215. Cavity 1240 includes gel stopped features such as overflow reservoir 1260, level set region 1250, and slope region 1255.

It should be realized that embodiments of the present invention are not limited to particular devices, device configurations, or cavity configurations, beyond provision of an overflow reservoir region to ensure that gel used to fill the cavity does not interact with a lid or a lid attach region of the cavity. Thus, embodiments will provide for a level set region at a height sufficient to provide a gap between the maximum height of the gel and the lid attach region, while at the same time ensuring that the gel has a sufficient depth above any pressure sensor or electrical couplings within the cavity to protect the pressure sensor or electrical couplings. Typically, such a depth is at least 300μ. The amount of gel required to attain such a depth, is dependent upon cavity volume determined by, for example, the angle of the slope region.

By now it should be appreciated that there has been provided a semiconductor device package that includes a package lead frame, one or more semiconductor device die coupled to the package lead frame, and an encapsulant formed over at least a portion of the one or more semiconductor device die and at least a portion of the lead frame. The encapsulant defines a cavity region and a gel stop feature within the cavity region. The gel stop feature includes a gel level set feature and a gel overflow reservoir. The cavity region is formed using film-assisted molding.

In one aspect of the above embodiment, the semiconductor device package further includes a first semiconductor device die mounted at a bottom surface of the cavity region and electrically coupled to one or more contacts exposed on the bottom surface of the cavity region. In a further aspect, the bottom surface of the cavity region is a portion of a major surface of the second semiconductor device die of the one or more semiconductor device die. In still a further aspect, the first semiconductor device die is a pressure sensor and the second semiconductor device die is a control die configured to process signals from the pressure sensor. In another aspect, the bottom surface of the cavity region is a portion of the package lead frame.

In another aspect of the above embodiment that includes the first semiconductor device die mounted at the bottom surface of the cavity region, a silicone gel is placed in the cavity region and over and surrounding the first semiconductor device die, where the depth of the silicone gel is controlled by the gel stop feature. In a further aspect, the gel stop feature is configured to permit a portion of the silicone gel to crest the gel level set feature and to settle in the gel overflow reservoir if an initial depth of the silicone gel is higher than the gel stop feature. In another further aspect, the encapsulant further defines a lid attach shoulder within the cavity region. A bottom portion of the lid attach shoulder is above a maximum silicone gel depth permitted by the gel stop feature, and a perimeter of the lid attach shoulder is greater than a perimeter of the bottom surface of the cavity. In still a further aspect, the semiconductor device package further includes a pressure permeable cap attached to the lid attach shoulder, where the pressure permeable cap is not in contact with a gel. In yet a further aspect, an automobile tire pressure monitoring system includes the semiconductor device package as described. In another aspect, the semiconductor device package further includes the encapsulant defining a sloped sidewall from an edge of the bottom surface of the cavity to the gel level set feature.

Another embodiment provides for a method that includes: providing a surface embodied within a packaged semiconductor device assembly; forming an encapsulated region over the surface using an encapsulant; forming a cavity region in the encapsulant over a first portion of the surface using a film-assisted molding technique; and, affixing a first semiconductor device on at least a portion of the first portion of the surface. A mold used for the film-assisted molding technique defines a gel stop feature along a wall of the cavity region. The gel stop feature includes a gel level set feature and a gel overflow reservoir feature. The first portion of the surface is exposed in the cavity region.

One aspect of the above embodiment further includes: providing a lead frame including a plurality of leads and a device flag; affixing a second semiconductor device to the device flag; and electrically coupling the second semiconductor device to one or more of the plurality of leads. The second semiconductor device includes a first and second major surface, where the first major surface is affixed to the device flag and the second major surface includes the surface embodied within the packaged semiconductor device assembly. Forming the encapsulated region includes encapsulating the lead frame, electrical contacts of the second semiconductor device coupled to the lead frame, and a portion of the second semiconductor device that excludes the first portion of the surface. In a further aspect, the second semiconductor device is a control die, the first semiconductor devices a pressure sensor, and the control die is configured to process signals from the pressure sensor.

Another aspect of the above embodiment further includes providing a lead frame that includes a plurality of leads and a device flag, where a major surface of the device flag includes the surface embodied within the packaged semiconductor device assembly. Still another aspect of the above embodiment further includes placing a silicone gel in the cavity region and over and surrounding the first semiconductor device, and placing a pressure permeable cap over the cavity region of a lid attach shoulder formed in the cavity by the mold. A bottom portion of the lid attach shoulder is above a maximum silicone gel depth permitted by the gel stop feature, and the pressure permeable cap is not in contact with the silicone gel. In a further aspect, the method further includes curing the silicone gel subsequent to placing the silicone gel in the cavity region, where the gel stop feature is configured to permit a portion of the silicone gel to crest the gel level set feature and the settle in the gel overflow reservoir if an initial depth of the silicone gel is higher than the gel stop feature.

Another embodiment provides a tire pressure monitoring system that includes a pressure sensor device package that includes: a package lead frame; one or more semiconductor device die coupled to the package lead frame; encapsulant formed over at least a portion of the one or more semiconductor device die and at least a portion of the lead frame, wherein the encapsulant defines a cavity region and a gel stop feature within the cavity region, the gel stop feature includes a gel level set feature and a gel overflow reservoir, and the cavity region is formed using film-assisted molding; and, a pressure sensor die mounted on the bottom surface of the cavity region and electrically coupled to a semiconductor device die of the one or more semiconductor device die using one or more contacts exposed on the bottom surface of the cavity region.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, a variety of semiconductor devices or MEMS devices may benefit from the use of gel-filled cavities that utilize gel stop regions such as those disclosed and claimed. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
   providing a second semiconductor device embodied within a packaged semiconductor device assembly, wherein the second semiconductor device comprises a first and second major surface;
   forming an encapsulated region over the second major surface of the second semiconductor device using an encapsulant;
   forming a cavity region in the encapsulant over a first portion of the second major surface of the second semiconductor device using a film-assisted molding technique, wherein
   a mold used for the film-assisted molding technique defines a gel stop feature along a wall of the cavity region,
   the gel stop feature comprises a gel level set feature and a gel overflow reservoir feature, wherein the gel stop feature is configured to permit silicone gel rising to a level above the gel level set feature to flow over the gel level set feature into the gel overflow reservoir feature;
   the first portion of the second major surface of the second semiconductor device is exposed in the cavity region; and
   affixing a first semiconductor device on at least a portion of the first portion of the second major surface of the second semiconductor device, wherein the first semiconductor device is located entirely within the cavity region.

2. The method of claim 1 further comprising: providing a lead frame comprising a plurality of leads and a flag portion of the lead frame;
   affixing the second semiconductor device to the flag portion of the lead frame, wherein
   the first major surface is affixed to the flag portion of the lead frame and electrically coupling the second semiconductor device to one or more of the plurality of leads, wherein said forming the encapsulated region comprises encapsulating the lead frame, electrical contacts of the second semiconductor device coupled to the lead frame, and a portion of the second semiconductor device excluding the first portion of the surface.

3. The method of claim 2 wherein the second semiconductor device is a control die, the first semiconductor device is a pressure sensor, and the control die is configured to process signals from the pressure sensor.

4. The method of claim 1 further comprising: placing a silicone gel in the cavity region and over and surrounding the first semiconductor device, and placing a pressure permeable cap over the cavity region on a lid attach shoulder formed in the cavity by the mold, wherein a bottom portion of the lid attach shoulder is above a maximum silicone gel depth permitted by the gel stop feature, and the pressure permeable cap is not in contact with the silicone gel.

5. The method of claim 4 further comprising: curing the silicone gel subsequent to said placing the silicone gel in the cavity region.

* * * * *